United States Patent
Sylvestre et al.

(10) Patent No.: US 7,482,180 B1
(45) Date of Patent: Jan. 27, 2009

(54) METHOD FOR DETERMINING THE IMPACT OF LAYER THICKNESSES ON LAMINATE WARPAGE

(75) Inventors: Julien Sylvestre, Chambly (CA); Jean Audet, Granby (CA); Marco Gauvin, Granby (CA); Sylvain Pharand, St-Bruno (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/111,196

(22) Filed: Apr. 29, 2008

(51) Int. Cl.
*H01L 21/66* (2006.01)
(52) U.S. Cl. .................. 438/15; 438/125; 257/E21.525
(58) Field of Classification Search .................. 438/457
See application file for complete search history.

(56) References Cited

U.S. PATENT DOCUMENTS

| | | | |
|---|---|---|---|
| 5,399,229 | A | 3/1995 | Stefani et al. |
| 6,603,201 | B1 * | 8/2003 | Thavarajah et al. ......... 257/700 |
| 7,222,316 | B2 | 5/2007 | Fukuzono et al. |
| 7,326,025 | B2 * | 2/2008 | Viluan et al. ................ 414/676 |
| 2004/0155339 | A1 * | 8/2004 | Infantolino et al. ......... 257/747 |
| 2004/0217453 | A1 * | 11/2004 | Ogino et al. ................ 257/669 |
| 2006/0036401 | A1 | 2/2006 | Kobayashi et al. |
| 2007/0087529 | A1 | 4/2007 | Chung et al. |

FOREIGN PATENT DOCUMENTS

| | | |
|---|---|---|
| JP | 2004013437 A1 | 1/2004 |
| JP | 2006278803 A1 | 10/2006 |
| WO | WO2008001922 A1 | 1/2008 |

OTHER PUBLICATIONS

Hong, Li-Ching (Department of Mechanical Engineering, National Cheng Kung University); Hwang, Sheng-Jye; Lee, Huei-Huang; Huang, Durn-Yuan, Simulation of Warpage Considering both Thermal and Cure Induced Shrinkage During Molding in IC Packaging, 2004 4th IEEE International Conference on Polymers and Adhesives in Microelectronics and Photonics, 2004, p. 78-84.

(Continued)

*Primary Examiner*—Stephen W Smoot
(74) *Attorney, Agent, or Firm*—Nelson and Nelson; Daniel P. Nelson; Alexis V. Nelson

(57) ABSTRACT

A method for analyzing the warpage of organic laminates used in flip chip packages includes collecting warpage data and layer thickness data for several laminates. A principal components analysis may then be performed on the thickness data to calculate orthogonal basis vectors to re-express the thickness data in a different basis. The thickness data may then be projected onto the orthogonal basis vectors. A linear model may be generated that expresses the warpage data for each laminate in terms of the projection of corresponding thickness data onto the orthogonal basis vectors, each projection multiplied by a weight. These weights may then be analyzed to determine the contribution of each orthogonal basis vector to the variance of the warpage data. The contribution and structure of each orthogonal basis vector may then be interpreted to estimate the importance of each layer or combination of layers in contributing to the laminate warpage.

1 Claim, 2 Drawing Sheets

OTHER PUBLICATIONS

Polsky, Y.(Sch. of Mech. Eng., Georgia Inst. of Technol., Atlanta, GA, USA); Ume, C.; Sutherlin, W., Application of Thermoelastic Lamination Theory to Predict Warpage of a Symmetric and Simply Supported Printed Wiring Board during Temperature Cycling, 1998 Proceedings, 48th Electronic Components and Technology Conference (Cat. No. 98CH36206), 1998, p. 345-52.

Cepeda-Rizo, J. (Department of Mechanical and Aerospace Engineering, California State University); Yeh, Hsien-Yang; Teneketges, N., Characterization and Modeling of Printed Wiring Board Warpage and its Effect on LGA Separable Interconnects, Journal of Electronic Packaging, Transactions of the ASME, v 127, n 2, Jun. 2005, p. 178-184.

Raj, P. Markondeya (Packaging Research Center, Georgia Institute of Technology); Bansal, S.; Shinotani, K.; Bhattacharya, S.; Tummala, R.; Lance, M.J., In-Situ Stress and Warpage Measurements to Investigate Reliability of Flip-Chip on Board Assembly without Underfill, Proceedings—Electronic Components and Technology Conference, 2003, p. 148-155.

Ming, Li (Key Lab. of MEMS, Southeast Univ., Nanjing, China); Jing Song; Qing-An Huang; Fan-Xiu Chen; Jie-Ying Tang, The Thermomechanical Coupling Effect in Multi-Layered Microelectronic Packaging Structures, ICSICT-2006: 2006 8th International Conference on Solid-State and Integrated Circuit Technology, Proceedings, 2007, p. 2135-2137.

* cited by examiner

METHOD FOR DETERMINING THE IMPACT OF LAYER THICKNESSES ON LAMINATE WARPAGE

BACKGROUND OF THE INVENTION

1. Field of the Invention

This invention relates to integrated circuit packaging and more particularly to methods for analyzing laminate warpage in integrated circuit packaging.

2. Description of the Related Art

In recent years, organic laminates have become a popular choice in flip-chip packages as a way to reduce costs compared to conventional laminates. Organic laminates, however, are typically characterized by significant mismatch of the coefficient of thermal expansion (CTE) between layers. This mismatch creates significant differences in thermal expansion or contraction during the fabrication process, causing the laminate to warp. Among other consequences, this warpage makes it difficult to produce reliable solder interconnects between the organic laminate and a chip during the chip joining process.

Currently, manufacturers of organic laminates cannot easily produce substrates with a low coplanarity, especially in complex designs (e.g., laminates with a large number of build-up layers). The burden of producing reliable microelectronic packages currently resides with the packaging industry, which has to develop complex and expensive capping processes, for instance, to alleviate the laminate warpage problem. Although some process parameters may be modified to reduce laminate warpage during manufacture, laminate characteristics that contribute to warpage need to be understood properly in order to know which parameters to modify.

In view of the foregoing, what are needed are methods to effectively analyze warpage in organic laminates. Further needed are methods to understand which laminate characteristics are the primary contributors to warpage. Yet further needed are methods to determine which layers or groups of layers are the primary contributors to laminate warpage. Yet further needed are methods to determine how layer thicknesses contribute to laminate warpage.

SUMMARY OF THE INVENTION

The invention has been developed in response to the present state of the art and, in particular, in response to the problems and needs in the art that have not yet been fully solved by currently available methods for analyzing laminate warpage. Accordingly, the invention has been developed to provide improved methods for analyzing the warpage of organic laminates used in flip chip packages. The features and advantages of the invention will become more fully apparent from the following description and appended claims, or may be learned by practice of the invention as set forth hereinafter.

Consistent with the foregoing, a method for analyzing the warpage of organic laminates used in flip chip packages is disclosed herein. In one embodiment, the method includes providing multiple organic laminates, each laminate having multiple layers. Warpage data may then be collected by measuring the warpage of each laminate. Thickness data may also be gathered by measuring layer thicknesses for each laminate at several different points after the laminates have been cross-sectioned. A principal components analysis may then be performed on the thickness data to calculate orthogonal basis vectors to re-express the thickness data in a different basis. The thickness data may then be projected onto the orthogonal basis vectors.

A linear model may be generated that expresses the warpage data for each laminate in terms of the projection of corresponding thickness data onto the orthogonal basis vectors, each projection multiplied by a weight. These weights may then be analyzed to determine the contribution of each orthogonal basis vector to the variance of the warpage data. The contribution and structure of each orthogonal basis vector may then be interpreted to estimate the importance of each layer or combination of layers in contributing to the laminate warpage.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION OF THE INVENTION

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

Figure 1:
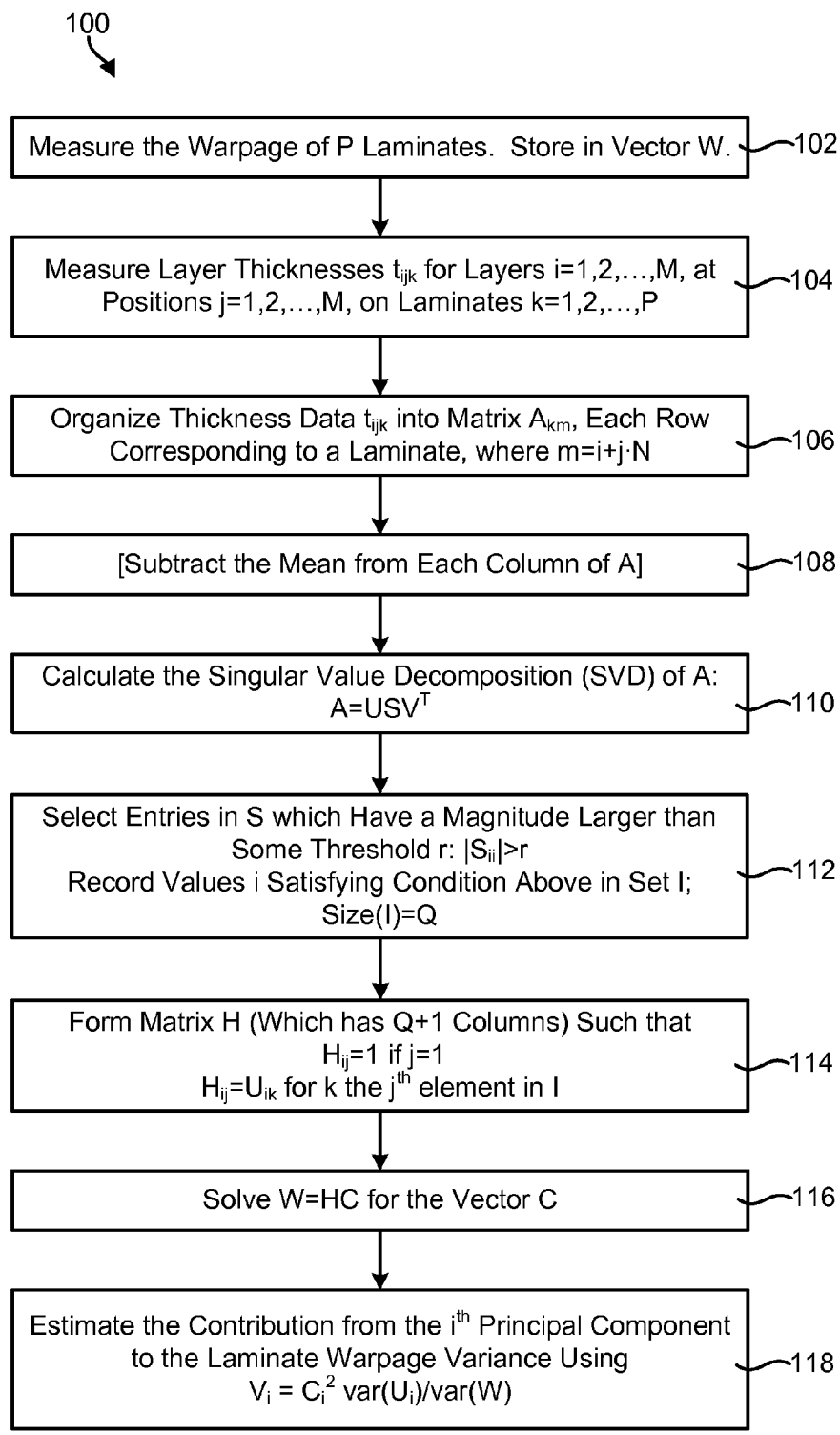
FIG. 1 is a flow chart of one embodiment of a method for determining the impact of layer thicknesses on laminate warpage.

Referring to FIG. 1, as previously mentioned, organic laminates used in flip-chip packaging are prone to warp due to significant thermo-mechanical mismatch between layers. In order to address the warpage problem, laminate characteristics that contribute to warpage need to be understood properly in order to determine which characteristics or process parameters to modify. Although there are various factors that may contribute to laminate warpage, the inventors of the present invention have determined that layer thicknesses, or variations in layer thicknesses, contribute more significantly to laminate warpage than once thought. Thus, methods and techniques are needed to effectively analyze the impact of layer thicknesses on warpage such that the layer thicknesses, or the variability thereof, may be modified to reduce warpage.

In selected embodiments in accordance with the invention, a method 100 for determining the impact of layer thicknesses on laminate warpage may include initially collecting a number of organic laminates. Each laminate may have a different shape due to process variations or other factors that occur during manufacture. The warpage of the organic laminates may then be measured 102 in a conventional manner (e.g., using JEDEC standards, etc.) at room temperature and optionally at other temperatures to generate a warpage value for each laminate. A sign may be assigned to the warpage value to represent the general convexity or concavity of the laminate shape. If warpage data at an elevated temperature are available, the difference between the elevated temperature data and the room-temperature data may be used to remove athermal contributors to warpage, thereby solely focusing on warpage components that are temperature dependent. The warpage data may be stored in a vector "W," the use of which will be explained in more detail hereafter.

Figure 2:
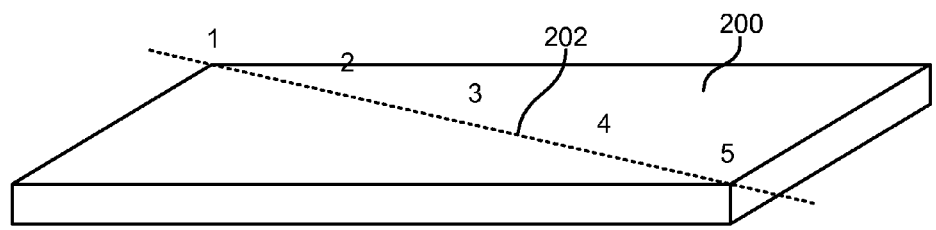
FIG. 2 is a high-level perspective view (not to scale) of one embodiment of an organic laminate.
Figure 3:
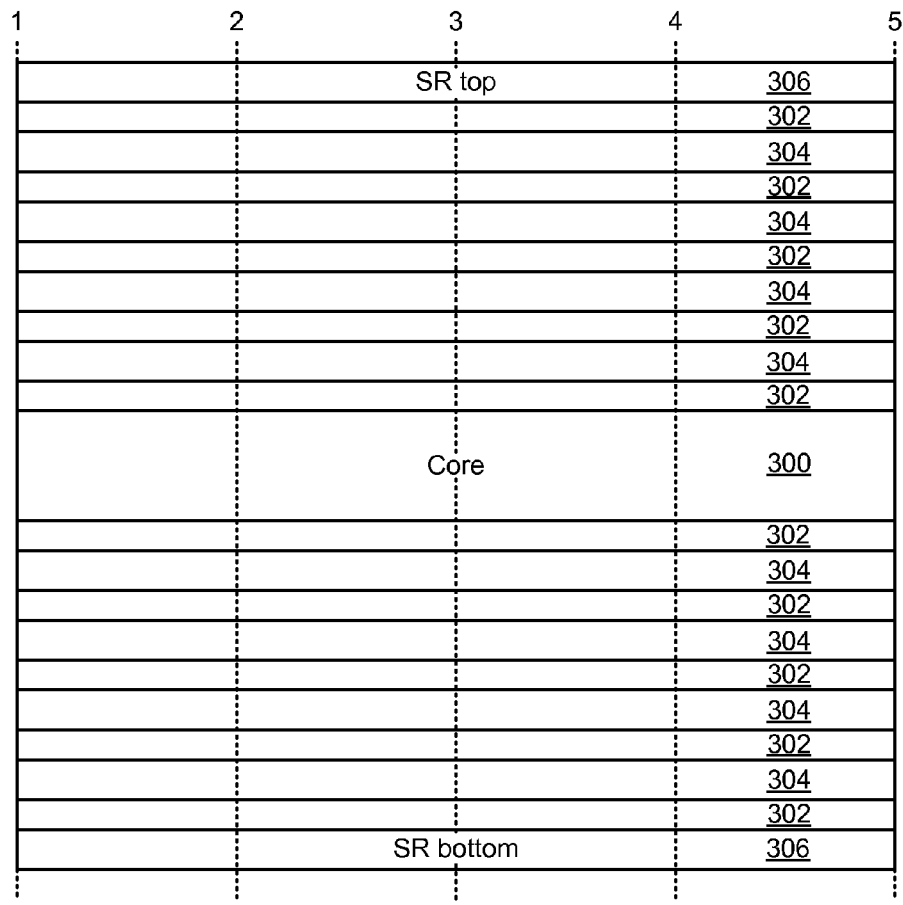
FIG. 3 is a cross-sectional profile view (not to scale) of the organic laminate illustrated in FIG. 2.

Each laminate may then be cross-sectioned to measure the thickness of each layer in the laminate. For example, as shown in FIG. 2, each laminate 200 may be cross-sectioned along a diagonal line 202 in order to measure the thickness of each layer at several different locations. FIG. 3 shows a side profile of the laminate 200 after it has been cross-sectioned. In this example, the laminate 200 is a 4-2-4 laminate, as is known in the art. This laminate 200 may include a fiber-reinforced core 300, copper layers 302, dielectric layers 304, and resin-based solder resist layers 306. Structures such as vias between the layers are omitted for simplicity purposes. The illustrated laminate 200 is provided only by way of example and is not intended to be limiting. Indeed, the methods disclosed herein may be used with laminate structures having various different structures, numbers of layers, layer thicknesses, layer materials, and so forth.

After the laminate 200 has been cross-sectioned, the thickness of each layer 300, 302, 304, 306 may be measured 104 at several different points within the laminate 200. For example, the layer thicknesses may be measured 104 at points 1 through 5, as shown in FIGS. 2 and 3. The number and location of the measurement points may be varied as needed. In certain cases, measurements at various locations within the layers may be averaged to reduce the dimensionality of the data. In certain embodiments, optical measurements may be used to measure the thickness of each layer at several different locations. For the purposes of this description, the thickness data may be represented as $t_{ijk}$, for layers i=1, 2, . . . , N, at locations j=1, 2, . . . , M, and on laminates k=1, 2, . . . , P, where N is the number of layers, M is the number of measurement points, and P is the number of measured laminates.

After the thickness measurements $t_{ijk}$ have been collected, the thickness measurements may be organized 106 into matrix format. For example, the thickness measurements may be organized 106 into a matrix $A_{km}$ (hereinafter referred to as matrix A), with each row containing thickness measurements for a separate laminate as follows:

$$A_{km} = t_{ijk},$$

where m=i+j·N, so that m ranges from 1 to R=M·N. If desired, the mean may be subtracted 108 from each column of A, although this is not necessary.

Next, the method 100 may include calculating 110 the singular value decomposition (SVD) of A to project the thickness data into a different basis in accordance with the following equation:

$$A = USV^T$$

where V is an R×R matrix with columns defining a set of mutually orthonormal basis vectors, S is an R×R diagonal matrix with non-zero weight values along its diagonal, and U is a P×R matrix, with $U_{ij}$ being the projection of the thickness data for laminate i onto the principal component j ($j^{th}$ column of V).

After the SVD of A has been computed 110, the method 100 may include selecting 112 entries in the matrix S that have a magnitude greater than some threshold r (i.e., $|S_{ii}|>r$). This step may be used to discard principal components that are deemed to be insignificant or represent noise. Next, a matrix H may be constructed 114 containing only the projections on the principal components that were deemed to be significant in step 112. Thus, the matrix H is a subset of the matrix U previously discussed, with the exception that the first column of H is a column of ones (a numerical technique to achieve a more accurate solution). More precisely, if I represents the set of indices i such that $|S_{ii}|>r$, then $H_{j1}=1$ and $H_{ji}=U_{ji}$, for j=1 . . . P, and i the indices in I.

Next, the method 100 may include solving 116 the linear model W=HC for the vector C, where H is the matrix generated in step 114 and W is the vector containing the P warpage measurements collected in step 102. Once the vector C is calculated 116, the contribution of each principal component to the warpage variance may be estimated 118 using the following formula:

$$V_i = C_i^2 \mathrm{var}(U_i)/\mathrm{var}(W)$$

where $V_i$ is the relative warpage variance from the $i^{th}$ principal component, $U_i$ is the projection of the thickness data onto the $i^{th}$ principal component, and $C_i$ is the corresponding weight calculated in step 116. The function var( ) is the sample variance of its vector argument. The sum of $V_i$ over all of the principal components should be one. Once this calculation is performed, the principal components that most significantly contribute to the variance of the laminate warpage will be evident. This will also provide information with regard to what layers or groups of layers most significantly contribute to the variability of the warpage. With this information, laminate manufacturing processes may be optimized by focusing improvements on these layers or groups of layers. For example, by adjusting the nominal value or variability of the thicknesses of these layers, laminate warpage may be controlled more effectively.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method to analyze the warpage of organic laminates used in flip-chip packaging, the method comprising:
    providing a plurality of organic laminates, each laminate comprising a plurality of layers;
    collecting warpage data by measuring the warpage of each laminate;
    gathering thickness data by measuring layer thicknesses of each laminate at several different points of each laminate;
    performing a principal components analysis on the thickness data to calculate orthogonal basis vectors to re-express the thickness data in a different basis;
    projecting the thickness data for each laminate onto the orthogonal basis vectors;
    forming a linear model expressing the warpage data for each laminate in terms of the projection of corresponding thickness data onto the orthogonal basis vectors, each projection multiplied by a weight;
    analyzing the weights to determine the contribution of each orthogonal basis vector to the variance of the warpage data; and
    interpreting the contribution and structure of each orthogonal basis vector to estimate the importance of each layer or combination of layers in contributing to the warpage of the laminates.

* * * * *